United States Patent [19]
Kano

[11] Patent Number: 6,008,530
[45] Date of Patent: Dec. 28, 1999

[54] POLYHEDRAL IC PACKAGE FOR MAKING THREE DIMENSIONALLY EXPANDABLE ASSEMBLIES

[75] Inventor: Ryuichi Kano, Hyogo, Japan

[73] Assignee: NEC Corporation, Tokyo, Japan

[21] Appl. No.: 09/079,945

[22] Filed: May 15, 1998

[30] Foreign Application Priority Data

May 29, 1997 [JP] Japan ..................................... 9-139515

[51] Int. Cl.$^6$ ........................... H01L 25/04; H01L 25/18; H01L 25/00; H05K 1/18
[52] U.S. Cl. ........................... 257/686; 257/698; 257/696; 257/685; 257/723; 257/730; 257/738; 257/693; 257/700
[58] Field of Search ..................................... 257/661, 696, 257/698, 734, 737, 738, 730, 723, 686, 685, 700, 758, 690–693

[56] References Cited

U.S. PATENT DOCUMENTS

| | | | |
|---|---|---|---|
| 4,394,712 | 7/1983 | Anthony | 257/698 |
| 5,166,773 | 11/1992 | Temple et al. | 257/693 |
| 5,291,062 | 3/1994 | Higgins, III | 257/698 |
| 5,343,346 | 8/1994 | Cipolla et al. | 257/686 |
| 5,434,452 | 7/1995 | Higgins, III | 257/737 |
| 5,621,190 | 4/1997 | Yamasaki et al. | 257/692 |
| 5,635,670 | 6/1997 | Kubota et al. | 257/686 |
| 5,679,976 | 10/1997 | Nishikawa et al. | 257/693 |
| 5,723,902 | 3/1998 | Katsumata | 257/693 |
| 5,767,575 | 6/1998 | Lan et al. | 257/738 |
| 5,781,413 | 7/1998 | Howell et al. | 257/686 |
| 5,783,870 | 7/1998 | Mostafazadeh et al. | 257/686 |
| 5,793,104 | 8/1998 | Kirkman | 257/734 |
| 5,814,883 | 9/1998 | Sawai et al. | 257/738 |
| 5,828,126 | 10/1998 | Thomas | 257/698 |
| 5,834,838 | 11/1998 | Anderson | 257/698 |
| 5,847,448 | 12/1998 | Val et al. | 257/686 |

FOREIGN PATENT DOCUMENTS

| | | |
|---|---|---|
| 61-99361 | 5/1986 | Japan . |
| 1-205456 | 8/1989 | Japan . |
| 6-61606 | 3/1994 | Japan . |
| 7-86493 | 3/1995 | Japan . |

*Primary Examiner*—Alexander Oscar Williams
*Attorney, Agent, or Firm*—Laff, Whitesel & Saret, Ltd.; J. Warren Whitesel

[57] ABSTRACT

A polyhedral IC package is provided with a plurality of pins for the purpose of connection to an semiconductor chip on each of the faces thereof, this IC package being stacked or arranged in a row by causing these pins to coincide with one another, thereby enabling three-dimensional arrangement of the IC package and in increase in the number of pins, without having to make the spacing between pins narrower. It is possible to provide an access hole on each face of the polyhedron for the purpose of enabling a physical interface.

15 Claims, 9 Drawing Sheets

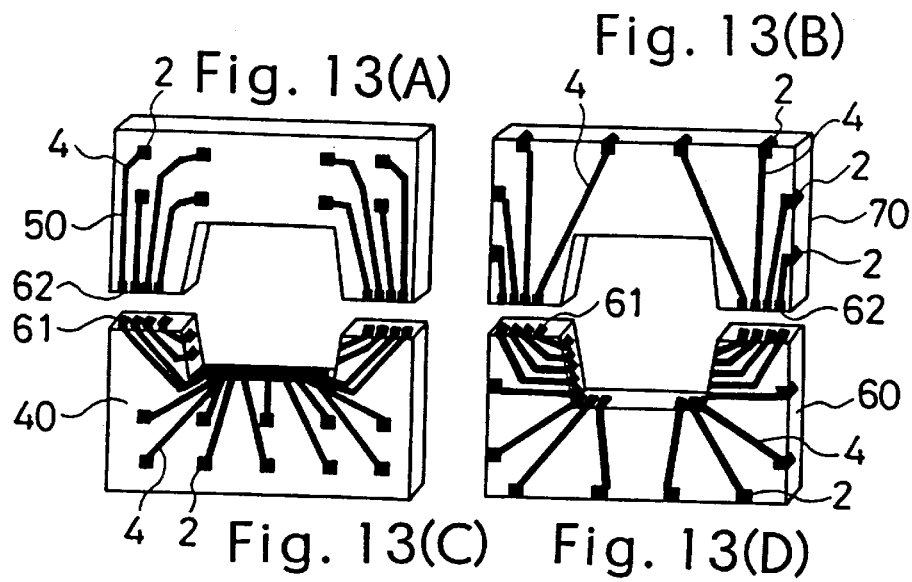
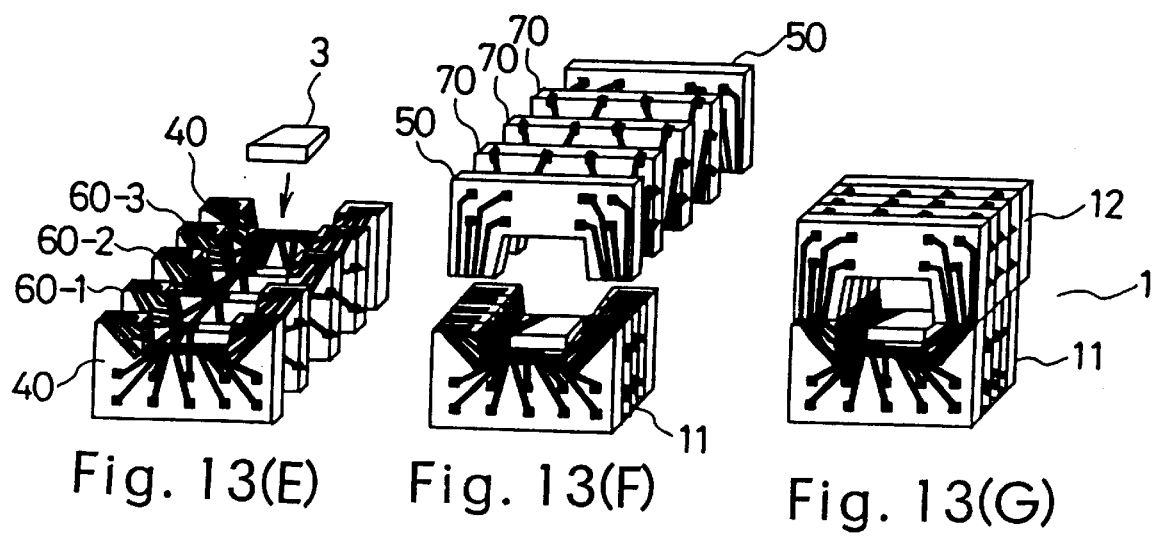
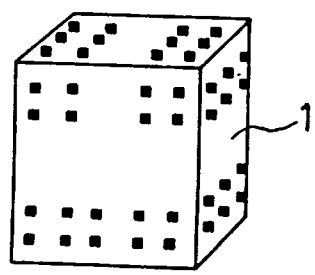

POLYHEDRAL IC PACKAGE FOR MAKING THREE DIMENSIONALLY EXPANDABLE ASSEMBLIES

BACKGROUND OF THE INVENTION

1. Field of the Invention

The present invention relates to an IC package in which signal transfer elements, such as pads or connecting terminals or the like (hereinafter referred to as pins) are disposed on a plurality of faces of a polyhedron, and more particularly to a polyhedral IC package which is designed with consideration given to a device that is suited for three-dimensional mounting.

2. Description of Related Art

FIG. 10(A) and 10(B) is a perspective view which shows an IC package of the past.

An IC package is generally the means of implementing an IC that requires a large number of pins, and in which the pins are arranged in a matrix pattern as shown in the drawing.

This example is one which shows the construction of an IC package that is used with a multi-layer printed circuit board in the past, FIG. 10 (A) showing the solder side, from which the pins 302 are clearly visible, and FIG. 10 (B) showing the front, component side, from which the pins 302 are barely visible.

As shown in FIG. 10 (A) and FIG. 10 (B), the pins 302 are mounted on only one side.

FIG. 11 is a drawing which shows the internal construction of the above-noted example.

The internal construction is this example is one formed by a semiconductor 303, the conductive leads 304, and the bonding wires 305, which make connections between the semiconductor 303 and the conductive leads 304.

As shown in this drawing, because the pins 302 are arranged on one base surface, in order to increase the number of pins, it is necessary either to reduce the spacing between pins, or to make the IC package itself larger.

However, the pin spacing is limited by considerations of mounting accuracy and of electrical characteristics, and enlargement of the IC package is also limited, because of the effect of conductive lead extension on electrical characteristics and the need to achieve mounting density.

Additionally, while the Japanese Unexamined Patent Publications Nos. 61-99361 and 7-86493 describe a method of wiring a plurality of semiconductor chips arranged almost in a straight line on a plan and on a face of a polyhedron, this method is one of shortening the wiring length between a plurality of semiconductor chips which are mounted within an IC package, rather than one which would provide a direct solution to the problem of wiring between IC packages.

In the case in which an IC package is mounted three-dimensionally, with the exception of an IC that is mounted on an outer surface, because access from the outside becomes impossible, it is impossible to mount an interface such as an interface for light, for fluid, or for gas.

Additionally, cooling and maintenance of an IC package located in a deep part becomes extremely difficult.

In the above-described prior art, because pins were only mounted on one surface of a three-dimensional IC package, with improvement in the functionality of ICs, the number of pins required on an IC package increases, and the resulting increase in the number of pins is accompanied by the problem of a narrowing of the pin-to-pin spacing.

To establish spacing between pins, as the demand for an increase in the number of IC package pins increases, because the distance between the semiconductor chip and the IC package pins increases, the wiring length between the semiconductor chip inside the IC package and the outside of the IC package becomes long, this presenting the problem of a worsening of the electrical characteristics.

Additionally, because the electrical interface between IC packages is implemented by transmission via the pattern on a printed circuit board, the transmission paths become long, and the wiring length between IC packages becomes long, this leading to the problem of a worsening of the electrical characteristics.

Additionally, if IC packages are mounted three-dimensionally, with the exception of an IC package which is located on an outer surface, because access from the outside is impossible, when IC packages are mounted three-dimensionally, with the exception of an IC package that is located on an outer surface, it is not possible to mount an interface such as an interface, for light, fluid, or gas, or other non-electrical interface.

When mounting IC packages to a multi-layer printed circuit board, there are cases in which the circuit configuration of the printed circuit board makes it difficult to make electrical contact with the terminals on the surface for adhesion to the substrate, and in inspection after mounting, there are cases in which it is difficult to make electrical contact with a terminal near an IC package terminal for the purpose of measuring the electrical characteristics.

Additionally, because of circuit configuration and electrical characteristics considerations, there is a need to mount components and wiring with high density in the region of an IC package, and also in order to mount components which require a physical mounting spacing on one and the same board, circuitry becomes concentrated only in the region of an IC package, resulting in a localized high circuit density.

To accommodate this, a problem arises in that the entire board must be made multi-layer.

In view of the above-described drawbacks in the prior art, an object of the present invention is to provide polyhedral IC package which enables an increase in the number of pins without making the spacing between pins narrow.

Another object of the present invention is to provide a polyhedral IC package which shortens the distance between a semiconductor chip that is mounted in the IC package and the pins thereof.

Yet another object of the present invention is to provide a polyhedral IC package that facilitates three-dimensional mounting.

Yet another object of the present invention is to provide a polyhedral IC package that, when mounting three-dimensionally, enables access from the outside to an IC package, even if the package is not located on an outer surface.

Yet another object of the present invention is to provide a polyhedral IC package which, after mounting, enables the measurement of electrical characteristics in the region of a terminal.

Still another object of the present invention is to provide a polyhedral IC package which, by mounting a plurality of the IC packages onto a printed circuit board, enables the achievement of a high-density printed circuit board with a small amount of partially high-concentration regions.

SUMMARY OF THE INVENTION

To achieve the above-noted object, a polyhedral IC package according to the present invention is an IC package that comprises a semiconductor chip, a plurality of pins, and a plurality of conductive leads, the IC package having a configuration of a polyhedral shape, and provided with the plurality of pins being arranged on at least one face of a plurality of faces of the polyhedron, the semiconductor chip installed inside a body portion of the polyhedron package and the conductive leads arranged inside a body portion of the polyhedron package and connecting the pins and the semiconductor chip.

Note that, in the present invention, the shape of this IC package being polyhedral and in one example of the present invention, the plurality of pins being disposed on each face of the polyhedron, a plurality of such IC packages being stacked or arranged in a line with the plurality of pins of these IC packages being caused to coincide, thereby enabling three-dimensional arrange of the IC packages without narrowing the spacing between pins when the number of pins is increased.

It is preferable that the pin mounting density on each face of the polyhedral per unit of surface area be made high, so that wiring length between the above-noted semiconductor chip and pins is made short.

It is also preferable that the polyhedron be a hexahedron.

It is further preferable that the hexahedron be an approximate cube.

It is yet further preferable that by mounting terminals on two or more faces of the polyhedron, inspection is made possible after mounting onto a printed circuit board, using a terminal other than a terminal provided for the purpose of mounting onto the printed circuit board.

It is further preferable that by mounting terminals on two or more faces of the polyhedron, simultaneous connection to two or more printed circuit boards is made possible.

It is yet further preferable that access holes be provided on each face of the polyhedron for the purpose of communication with an interface for the purpose of access from the outside.

It is also preferable that the interface be a physical, electrical, or optical interface.

It is also preferable that the access holes be used for the transmission of either information or physical drive.

It is also preferable that the access holes be provided in the approximate center of each of the faces of the polyhedron.

It is also preferable that the access holes establish three-dimensional access from the outside after connection and mounting.

By virtue of the above-noted constitution, the present invention meets the need to increase the number of pins on an IC package in response to improvements in the functionality.

Also, by improving the mounting density of pins per unit surface area, the present invention achieves a shortening of the wiring length between the semiconductor chip and the pins.

Additionally, by being mounted three-dimensionally in intimate contact, the present invention achieves a shortening of the wiring distance between packages.

When mounting the IC packages three-dimensionally in intimate contact in this manner, even with regard to packages that are not located on outer surfaces, it is possible to establish physical access from the outside, thereby enabling the mounting of non-electrical interfaces to such inner packages, and also facilitating the cooling and maintenance of these IC packages.

By establishing a terminal that is physically close to and electrically equivalent to a terminal for mounting to the printed circuit board on a face that is not mounted to the printed circuit board, electrical access for the purpose of inspection after mounting is facilitated.

Additionally, by means of terminals that are disposed on a plurality of faces, simultaneous mounting is possible to a plurality of printed circuit boards that have different mounting densities, thereby enabling mounting which considers the printed circuit board wiring, the mounting density, and the printed circuit board surface area.

BRIEF DESCRIPTION OF THE DRAWINGS

FIGS. 13(A) to 13(H) show another embodiment of a method for producing an IC package of the present invention;

DETAILED DESCRIPTION OF THE PREFERRED EMBODIMENTS

Embodiments of present invention are described below, with reference being made to the relevant accompanying drawings.

Figure 1:
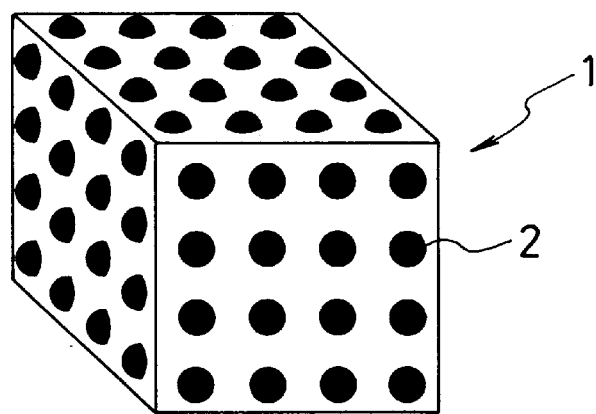
FIG. 1 is a perspective view which shows the first embodiment of a polyhedral IC package according to the present invention.

FIG. 1 is a perspective view which shows the first embodiment of an IC package according to the present invention. This IC package is a polyhedral IC package, with pins 2 mounted to each of the faces thereof.

The IC package 1 is implemented using a hexahedron made of an insulator such as ceramic, onto each of the faces of which the pins 2 are mounted. In this embodiment, the polyhedral IC package 1 is an approximately cubic polyhedron.

Figure 2:
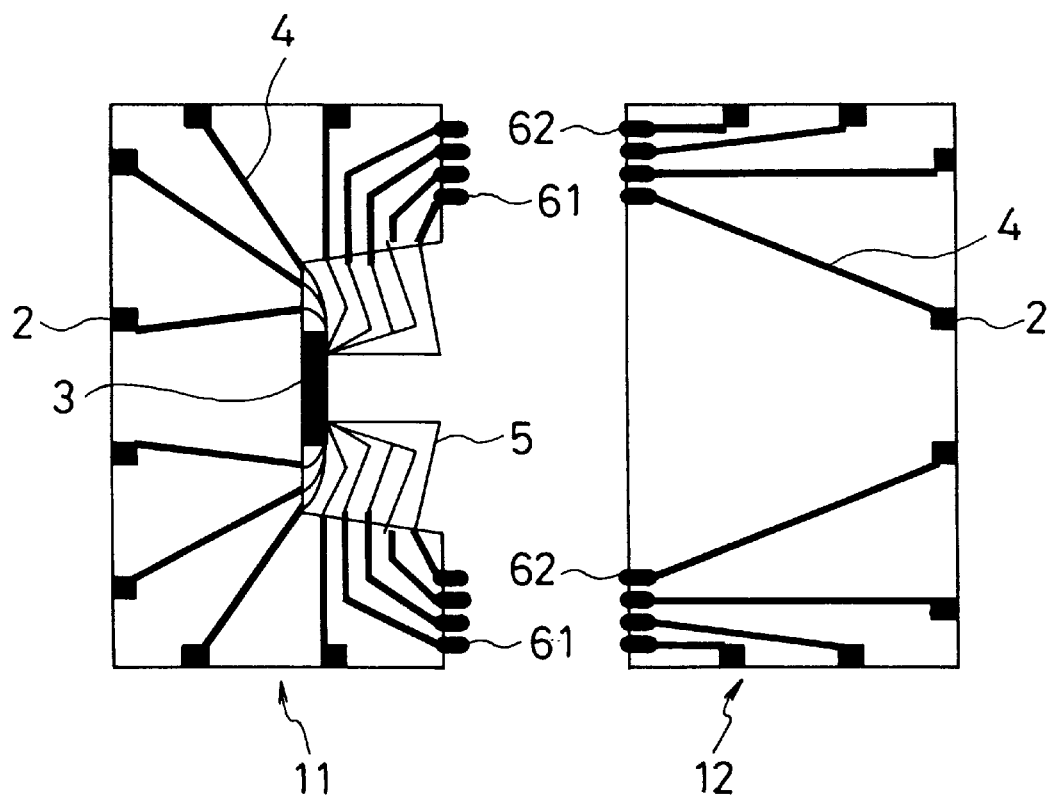
FIG. 2 is a cross-sectional view which shows the internal construction of the first embodiment of a polyhedral IC package according to the present invention.

FIG. 2 is a cross-sectional view which shows the internal construction of the polyhedral IC package which is shown in FIG. 1.

This cross-sectional view shows the condition of the joining of a first sub member portion 1 and a second sub member portion 12 so as to form the polyhedral IC package 1.

The inside of the polyhedral IC package 1 has a semiconductor chip 3, the pins 2, the conductive leads 4 which connect the semiconductor chip 3 with the pins 2, the bonding wires 5, and the connector 61.

The polyhedral IC package 12 is formed by the pins 2, the connector 62, and the conductive leads 4 which connect the pins 2 with the connector 62. That is, the polyhedral IC package 1 has a semiconductor chip 3, while the other polyhedral IC package 12 has no semiconductor chip.

The two rectangular parallelepipeds represented by the polyhedral IC package 1 and the polyhedral IC package 12 which has no semiconductor chip are configured so as to be joined together.

In the polyhedral IC package 1 the conductive leads 4 connect the pins 2, the semiconductor chip 3 and the connector 61.

The connector 61 makes connection to the connector 62 of the polyhedral IC package 12. The semiconductor chip 3 and the conductive leads 4 that are located within the polyhedral IC package 1 are joined together by the bonding wires 5.

Thus, the polyhedral IC package 1 and the polyhedral IC package 2 are electrically and physically joined by means of the connectors 61 and 62.

As is apparent from the above-mentioned explanation, the IC package of the present invention is basically comprises a semiconductor chip, a plurality of pins, and a plurality of conductive leads, the IC package having a configuration of a polyhedral shape, and provided with the plurality of pins being arranged on at least one face of a plurality of faces of the polyhedron, the semiconductor chip installed inside a body portion of the polyhedron package and the conductive leads arranged inside a body portion of the polyhedron package and connecting the pins and the semiconductor chip.

In the IC package of the present invention, the configuration of the polyhedron package may preferably a hexahedron and more preferably the hexahedron is an approximate cube.

Further in the present invention, the IC package comprises a plurality of sub member portions each having capability to be integrated to each other to form the one package and wherein at least a first sub member portion 11 thereof being provided with the semiconductor chip therein and a second sub member portion 12, the rest thereof being provided with or without the semiconductor chip therein.

In the present invention, the first sub member portion comprising a plurality of the pins being arranged on at least one face of the first sub member portion 11, the semiconductor chip installed inside a body portion of the sub member portion, a plurality of the conductive leads arranged inside a body portion of the first sub member portion 11 and a plurality of connectors on at least one surface thereof which can be attached to the second sub member portion 12.

Moreover, the second sub member portion 12 comprising a plurality of the pins being arranged on at least one face of the second sub member portion 12, a plurality of the conductive leads arranged inside a body portion of the second sub member portion, and a plurality of connectors on at least one surface thereof which can be attached to the first sub member portion.

Further, in the present invention, in the IC package, the first and second sub member portions 11, 12, are connected and integrated to each other by mating connectors provided on each one of the first and second sub member portions, to each other.

The access hole as used in the present invention, may preferably be provided on at least one of the faces of the polyhedron package for the purpose of making communication with an interface capable of accessing to the outside.

And the interface may be an interface selected from the group consisting of a physical interface, an electrical interface, and an optical interface, and further the access hole may also be used as a path for transmitting either information or drive power.

On the other hand, the access hole is provided in the approximate center of at least one face of the polyhedron and further, it may be provided through the body portion of the portion package so as to communicate the access hole provided on one face of the package with another the access hole provided on another face of the package.

Note that the polyhedron package of the present invention, has a capability of being contacted to two or more than two different kinds of substrate, simultaneously.

Figure 3:
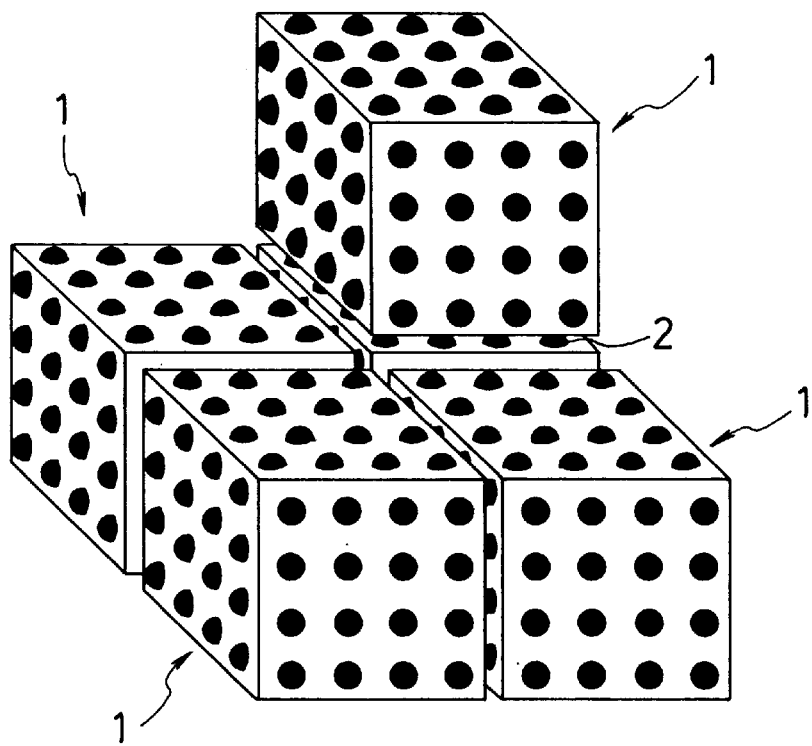
FIG. 3 is a perspective view which shows the configuration of the first embodiment of a polyhedral IC package according to the present invention as mounted.

FIG. 3 is a perspective view of the condition of the polyhedral IC package 1 shown in FIG. 1 as it is three-dimensionally mounted in intimate contact with similar packages. Between these polyhedral IC packages 1, there is a direct electrical connection by means of the pins 2, making it possible to avoid a worsening of the electrical characteristics brought about by wiring.

Figure 4:
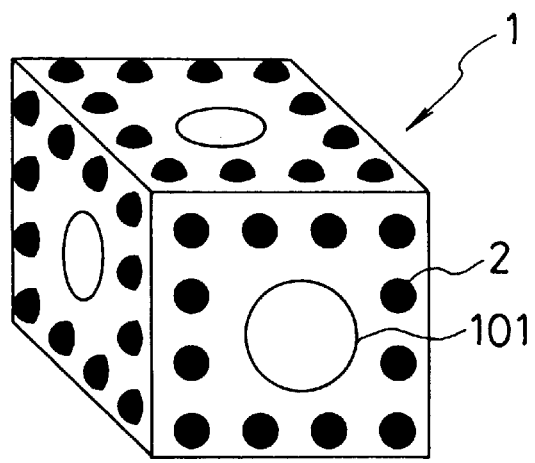
FIG. 4 is a perspective view which shows the second embodiment of an IC package according to the present invention.

FIG. 4 is a perspective view that shows the second embodiment of a polyhedral IC package according to the present invention.

In this embodiment, an access hole 101 for the purpose of physical access to the polyhedral IC package of FIG. 1, that is, for the purpose of an optical, gas, or fluid interface.

This access hole 101 is provided in the approximate center of the faces of the polyhedron, with pins 2 being provided in the area theresurrounding.

Figure 5:
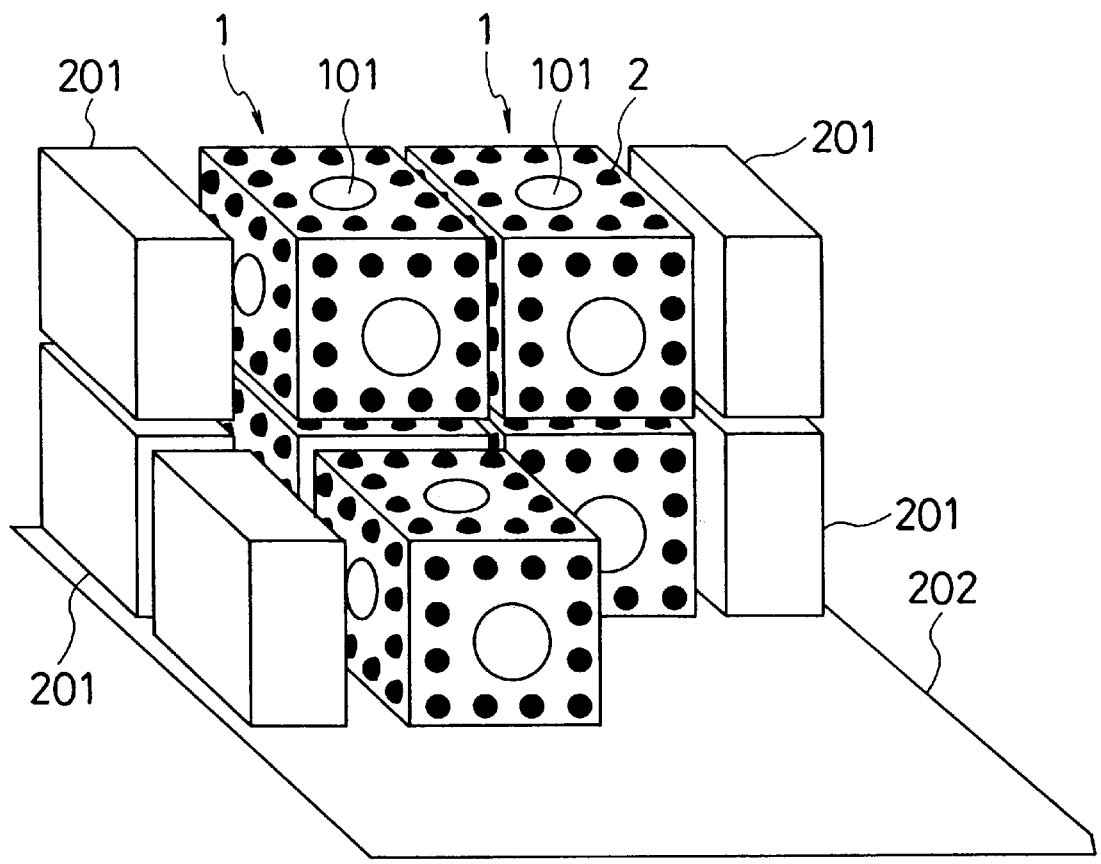
FIG. 5 is a perspective view which shows the configuration of the second embodiment of a polyhedral IC package according to the present invention as mounted.

FIG. 5 is a perspective view which shows the condition of the above-described polyhedral IC package 1 of FIG. 4 as three-dimensionally mounted in intimate contact. In the same manner as in FIG. 3, the polyhedral IC packages 1 are electrically and physically joined by means of the pins 2, with the polyhedral IC packages 1 being successively stacked.

In the surrounding area, there are located, for example, optical input/output modules 201, these communicating with an optical interface via each of the access holes 101 of the polyhedral IC packages 1.

Figure 6:
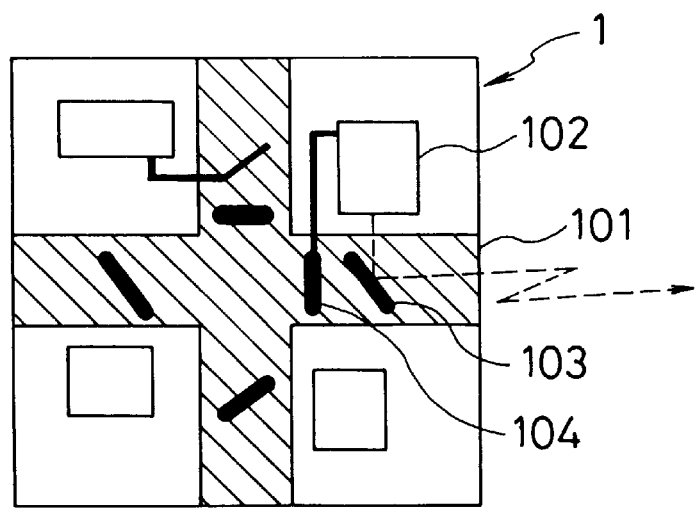
FIG. 6 is a cross-sectional view which shows the internal construction of the second embodiment of a polyhedral IC package according to the present invention.

FIG. 6 is a cross-sectional view which shows the internal construction of the above-described polyhedral IC package of FIG. 5.

In this embodiment, the physical access through hole 101 is used as a light path. The physical access through hole 101 is used as a light path for transmission of either information or drive power.

Light from outside the polyhedral IC package 1, this being the light being output from the optical input/output module 201 shown in FIG. 5, is reflected by means of a half-mirror 103, and guided to the optical interface 102, at which it is processed.

Light which passes through the half-mirror is controlled to either pass through or be block by the liquid-crystal shutter 104, which is controlled by the optical interface 102 and, in the case in which it passes through the shutter, it passes through the physical access through hole 101 and is propagated to an external package.

Figure 7:
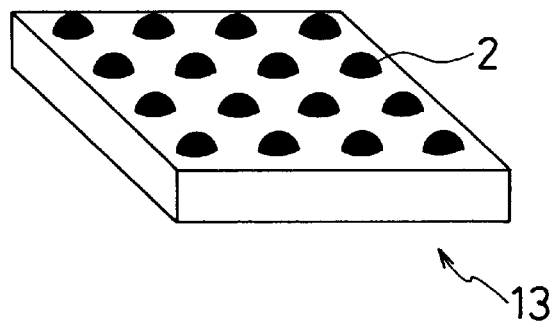
FIG. 7 is a perspective view which shows the third embodiment of a polyhedral IC package according to the present invention.

FIG. 7 is a perspective view of the third embodiment of a polyhedral IC package according to the present invention.

In this embodiment, the polyhedral IC package 13, in contrast to the first embodiment, in which the package was close to being a cube, is a polyhedron that is close to being a flat plane.

The pins 2 are in connection with the pins that are in the high-density part that is in electrical connection with the printed circuit board mounting face, high-density components being mounted onto the face that opposes the printed circuit board mounting face.

Figure 8:
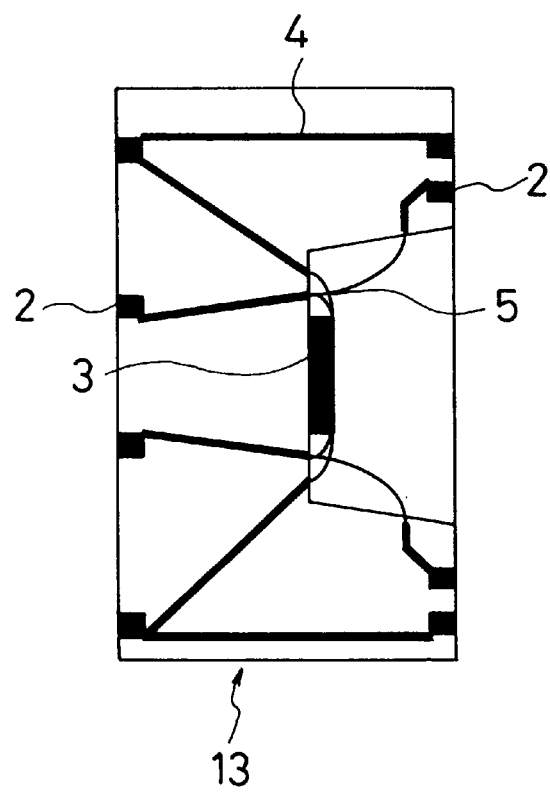
FIG. 8 is a cross-sectional view which shows the internal construction of the third embodiment of a polyhedral IC package according to the present invention.

FIG. 8 is a cross-sectional view which shows the internal construction of the polyhedral IC package which is shown in FIG. 7.

The polyhedral IC package 13 has within it a semiconductor chip 3, pins 2, conductive leads 4, which make connection between the semiconductor chip 3 and the pins 2, and the bonding wires 5.

The conductive leads 4 make connections between pins 2 and between pins 2 and the semiconductor chip 3.

Figure 9:
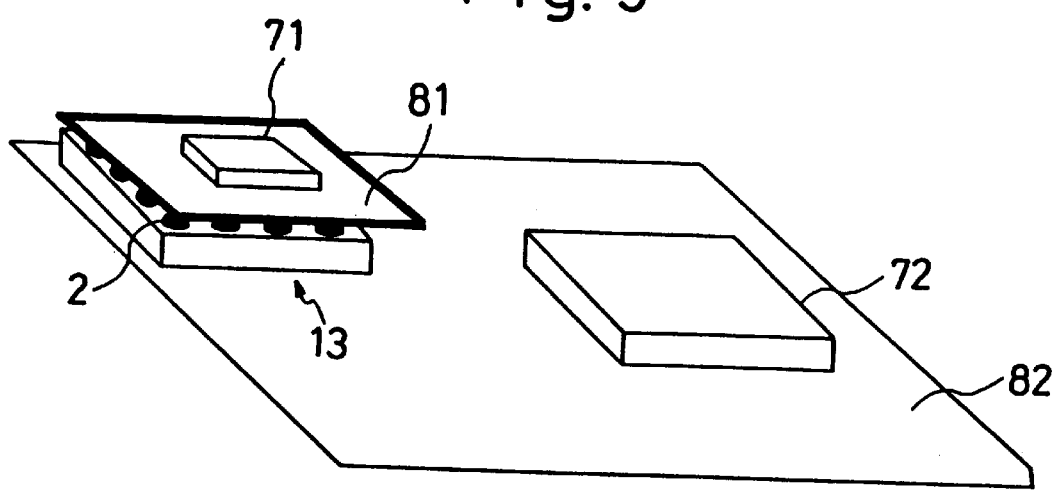
FIG. 9 is a perspective view which shows the configuration of the third embodiment of a polyhedral IC package according to the present invention as mounted.
Figure 10A:
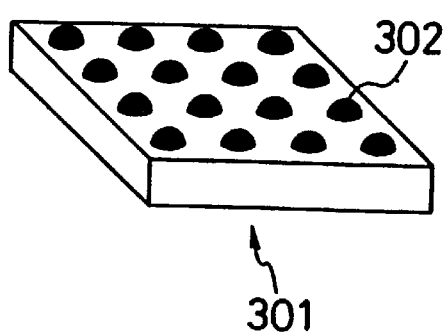
FIGS. 10(A) and 10(B) is a perspective view which shows an IC package of the past, with FIG. 10 (A) showing a side from which the pins are visible, and FIG. 10 (B) showing a side from which the pins are not visible.
Figure 10B:
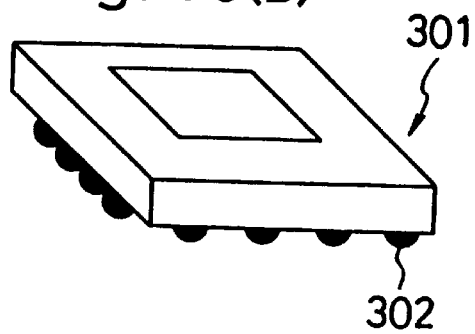
Figure 11:
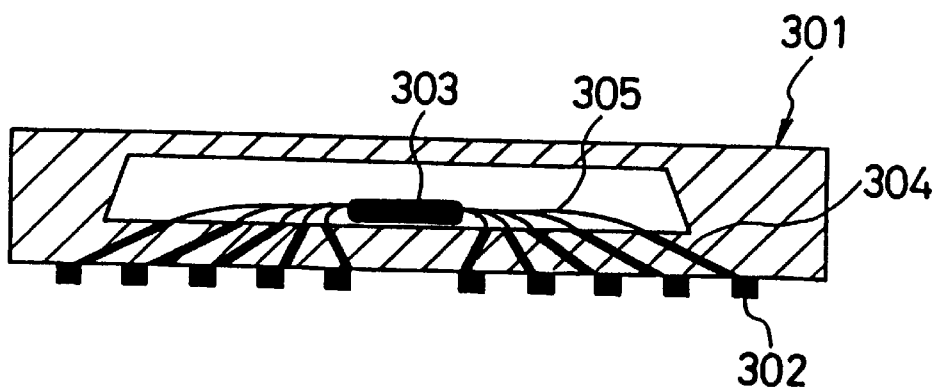
FIG. 11 is a cross-sectional view of the IC package as shown in FIG. 10 (*b*)

FIG. 9 is a perspective view which shows the polyhedral IC package 13 of FIG. 7, this showing the condition of the IC package mounted to printed circuit boards having a different mounting density, wiring density, and surface area.

The polyhedral IC package 13 is simultaneously mounted to a high-density multi-layer printed circuit board 81 onto which is mounted a high-mounting-density component 71, and to a low-density printed circuit board 82, onto which is mounted a component 72, which requires a mounting spacing.

By using the high-density printed circuit board 81, which is relatively expensive, in only the circuit part that absolutely requires high-density mounting, it is possible to use the low-density printed circuit board 82, which has low cost, to implement the circuit board required to provide the mounting spacing.

As shown in FIG. 3, the integrated IC package of the present invention comprises a plurality of the polyhedron packages as defined by claim 1, each of the polyhedron packages being assembled to each other by connecting the pins provided on one face of one the polyhedron package to the counter pins provided on an opposite face of opposite polyhedron package adjacently arranged to the previous one.

Further as shown in FIG. 5, each one of the IC package of the present invention includes an access hole which is provided inside one of the polyhedron packages and which is communicated to the separate access hole provided inside other polyhedron package adjacently arranged to the previous one.

Several embodiments of a method for producing the IC package of the present invention will be explained with reference to FIGS. 12A–12(F) to 14(A)–14(F), hereunder.

In FIG. 12(A)–12(F), one embodiment of a method for producing the IC package of the present invention is illustrated.

Figure 12A:
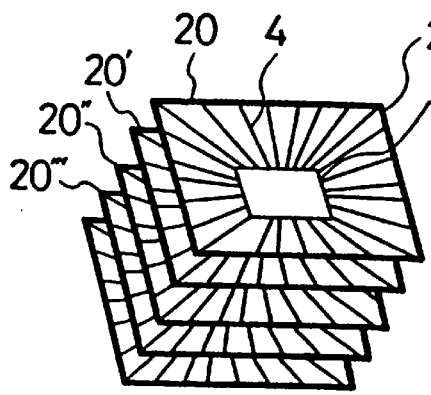
FIGS. 12(A) to 12(F) show one embodiment of a method for producing an IC package of the present invention.

At a first step, as shown in FIG. 12(A), a plurality of frames 20 in which a plurality of conduction leads 4, which would become the conduction leads 4 inside the completed IC package later, are supported by an outer frame 20-1 and inner frame 20-2.

Each of the ends of the respective conduction leads 4 are designed to be arranged so as to take a necessary position on a certain position of a certain face of the IC package when it will be completed.

The design for the arrangement of the respective conduction leads 4 of one frame may be different from that of other frame each other, among the frames 20, 20', 20", 20'". . . .

Figure 12B:
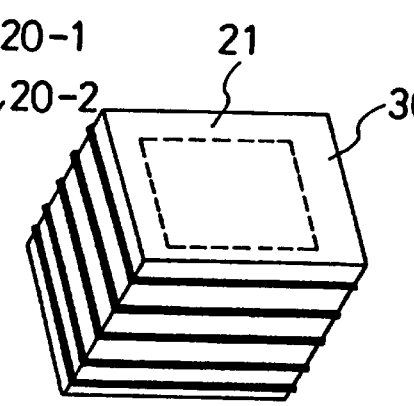

Then the plurality of such frames 20 are stacked with interposing a certain space therebetween and they are stationary fixed with synthetic resin 21 so as to form intermediate body portion 30, as shown in FIG. 12(B).

Figure 12C:
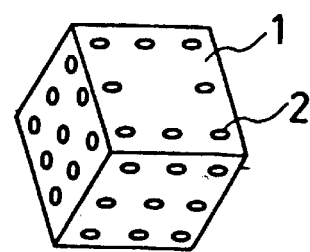

After that the intermediate body portion 30 is cut and ground on the overall surface thereof so as to expose the certain end of the conduction leads 4 on a certain face of the ground body as the pins 2, as shown in FIG. 12(C).

Figure 12D:
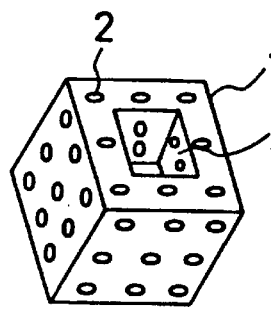

If necessary, a hole portion 23 may be provided inside the IC package so as to increase the number of the pins 2 or to secure a storage space therein, as shown in FIG. 12(D).

Figure 12E:
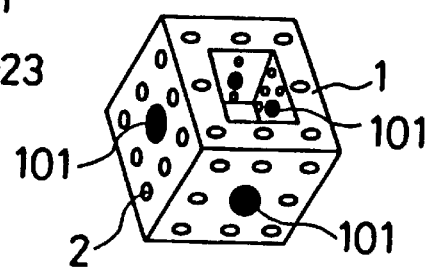
Figure 12F:
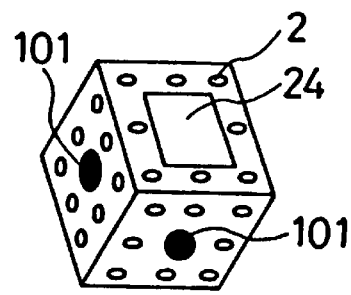

In the next step, the access holes 101 are provided on selected face of the IC package 1 so as to penetrate the wall portion of the IC package 1, as shown in FIG. 12(E) and after that the hole portion 23 is covered with a pertinent sealing member 24 to complete the IC package 1, as shown in FIG. 12(F).

The second embodiment of a method for producing the IC package of the present invention will be explained with reference to FIG. 13(A)–13(H).

At a first step, a plurality of piece of members 40, 50, 60, and 70 are prepared, previously, each of the piece of members including therein respectively arranged conduction leads 4 inside therein and having a plurality of pins 2 on the respective surface thereof which being connected to the conduction leads 4, as shown in FIGS. 13(A) to 13(D).

Then, as showing in FIG. 13(E), a plurality of such piece members 40 and a 60 are selectively assembled, for example, two such piece members 40 are arranged in the most front side position and the most rear side position and a plurality of such piece members 60 are arranged in parallel and adjacently to each other between the two piece members 40, so as to complete the first sub member 11 as shown in FIG. 2.

In the same manner, as shown in FIG. 13(F), a plurality of such piece members 50 and 70 are selectively assembled, for example, two such piece members 50 are arranged in the most front side position and the most rear side position and a plurality of such piece members 70 are arranged parallely and adjacently to each other between the two piece members 50, so as to complete the first sub member 12 as shown in FIG. 2.

Then, after installing a semiconductor chip 3 on inside surface of the sub member 11, both sub members 11 and 12 are connected to each other as shown in FIG. 13 (G) followed by cutting and grounding operation so as to form the IC package 1 as shown in FIG. 13(H).

The third embodiment of a method for producing the IC package of the present invention will be explained with reference to FIG. 14(A)–14(F).

Note that, the third embodiment of the method for producing the IC package of the present invention, relates to the IC package 1 as shown in FIG. 6.

Figure 14A:
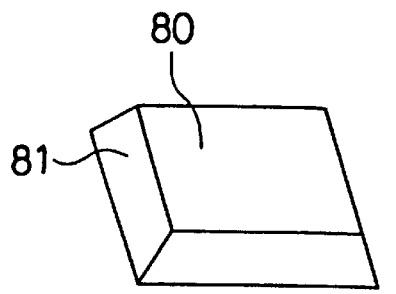
FIGS. 14(A) to 14(F) show further another embodiment of a method for producing an IC package of the present invention.

At a first step, a piece of member 80 with tapered side walls 81, is prepared as shown in FIG. 14(A) and a metallic deposition process is applied to overall surface of the piece of member 80 to cover the entire surface thereof with some metal film.

Figure 14B:
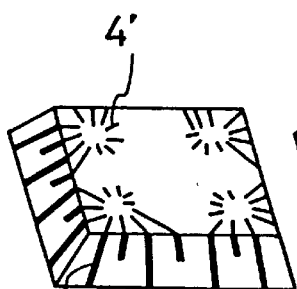

Then, as shown in FIG. 14(B), an etching operation is carried out to from a plurality of conduction leads 4 and a plurality of connecting portions 4'.

Figure 14C:
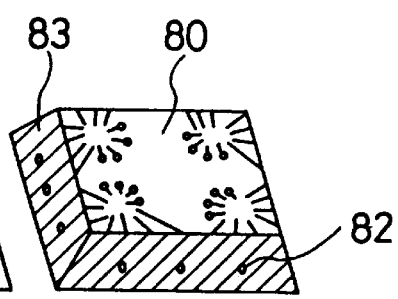
Figure 14D:
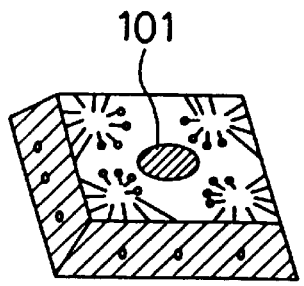

After that, with utilizing an insulation mask 83, a plurality of through holes 82 are formed on selected portion of the tapered side walls 81, as shown in FIG. 14(C) followed by an operation for forming an access hole 101 at a center portion of the piece of member 80, as shown in FIG. 14(D).

Figure 14E:
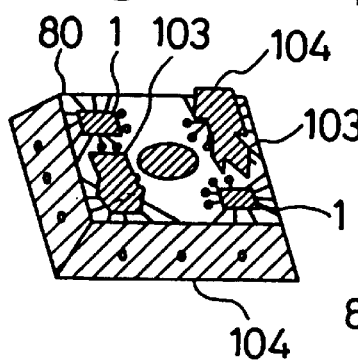

Finally, semiconductor chips 1, half mirrors 103 and shutter means 104 are mounted on the surface of the piece of member 80, utilizing, for example, bonding operation or the like, as shown in FIG. 14(E).

Figure 14F:
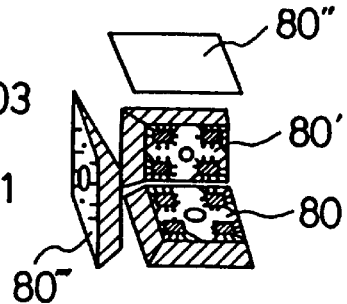

Then, a plurality of such piece of members 80, 80', 80", 80'''. . . are corrected and assembled to form a cubic body construction as the IC package as shown in FIG. 14(F).

Figure 15:
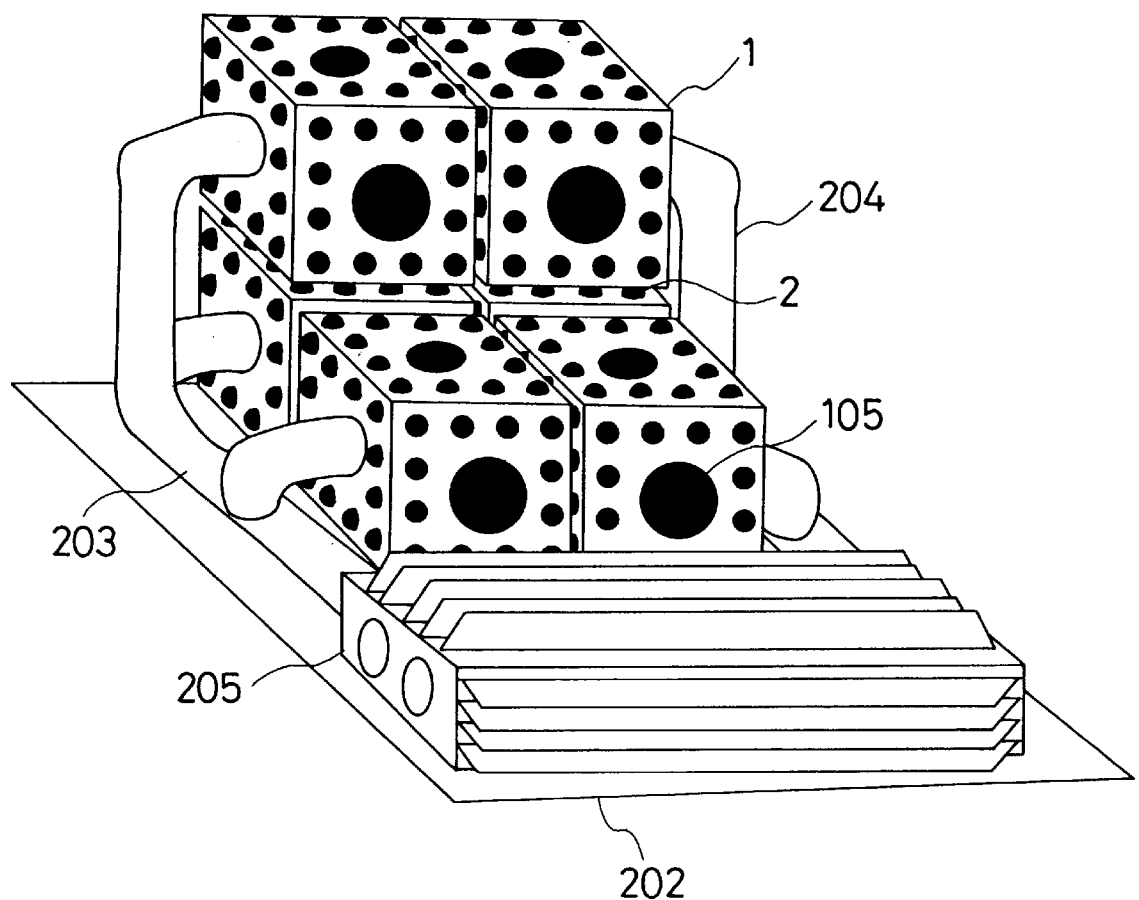
FIG. 15 is a perspective view which shows another embodiment of an integrated IC package device in which the access holes thereof are used for coolant transmitting path for cooling device with liquid coolant.

On the other hand, FIG. 15 shows another embodiment of the present invention in that a plurality of the IC packages 1 are integrated into a three dimensional configuration on a surface of a substrate 202 and several access holes are connected to each other to form paths for circulating coolant for cooling the IC package.

As apparent from FIG. 15, the several access holes 101 are connected to cooling tubes 203 and 204 which are connected to a cooling device 205, while other access holes not connected to the cooling tubes are sealed with suitable sealing member 105.

According to the present invention, by providing pins on a plurality of faces of a polyhedral IC package, it is possible to increase the number of pins to more than double the number for the case in which pins are provided on only one face. It is therefore possible to increase the number of pins without narrowing the spacing between pins.

By doing this, it is possible to increase circuit density and to integrate more functions into an IC.

Another effect of providing pins on a plurality of faces of a polyhedral IC package is that, compared to the case in which pins are provided on only one face, it is possible to shorten the distance between the semiconductor chip and the pins.

Thus, by not lengthening the wiring between the semiconductor chip disposed within the polyhedral IC package and a location outside the polyhedral IC package, it is possible to prevent a worsening of the electrical characteristics that would result from such lengthening of this wiring.

Additionally, by mounting these polyhedral IC packages in intimate contact with one another, the transmission paths can be shortened, thereby improving the electrical characteristics. Thus, there is an improvement in electrical characteristics, in comparison to the case in which the electrical interface between the polyhedral IC packages is implemented by a wiring pattern on a printed circuit board.

By making a through hole on the polyhedral IC package that enables physical access thereto from the outside, it is possible to establish physical access, even with respect to a polyhedral IC package that is mounting in close contact inside a group of polyhedral IC packages.

Therefore, even when the polyhedral IC packages are three-dimensionally mounted in intimate contact with one another, it is possible to establish physical access from the outside, even with respect to an polyhedral IC package that is located deep within the mounted IC packages.

Additionally, by establishing a terminal that is physically close to and electrically equivalent to a terminal for mounting to the printed circuit board on face that is not mounted to the printed circuit board, electrical access is facilitated.

Therefore, when performing inspection after mounting, it is possible to measure the electrical characteristics of the terminal, regardless of the circuit condition of the board to which the package is mounted.

Additionally, by means of terminals that are disposed on a plurality of faces, it is possible to mount a child board with a polyhedral IC package mounted to it to a mother board.

Therefore, by implementing only the part of a circuit which requires high density mounting by means of a separated high-mounting-density multi-layer printed circuit board, and implementing other parts by means of a low-cost, low-density board, it is not necessary to implement a large surface area board using a high-cost high-mounting-density multi-layer printed circuit board.

What is claimed is:

1. An IC package comprising a semiconductor chip, a plurality of pins, and a plurality of conductive lead, said IC package having a configuration of a polyhedral shape, and provided with said plurality of pins arranged on at least two nonparallel faces of a plurality of faces of said polyhedron, said semiconductor chip being installed inside a body portion of said polyhedron package and said conductive leads arranged inside a body portion of said polyhedron package and connecting said pins and said semiconductor chip, whereby a plurality of said packages may be assembled in a three dimensional array.

2. An IC package according to claim 1, wherein the configuration of said polyhedron package is a hexahedron.

3. An IC package according to claim 2, Wherein said hexahedron is an approximate cube.

4. An IC package according to claim 1, wherein said polyhedron package has a capability of being contacted to at least two different kinds of substrate, simultaneously.

5. An integrated IC package comprising a plurality of said polyhedron packages as defined by claim 1, each of said polyhedron packages being assembled to each other by connecting said pins provided on one face of one said polyhedron package to counter pins provided on an opposite face of an opposite and adjacent polyhedron package.

6. An integrated IC package according to claim 5, wherein an access hole which is provided inside one of said polyhedron packages is communication with separate access hole provided inside another adjacent polyhedron package.

7. An IC package comprising a semiconductor chip, a plurality of pins, and a plurality of conductive lead, said IC package having a configuration of a polyhedral shape, and provided with said plurality of pins arranged on at least one face of a plurality of faces of said polyhedron, said semiconductor chip being installed inside a body portion of said polyhedron package and said conductive leads arranged inside a body portion of said polyhedron package and connecting said pins and said semiconductor chip, said polyhedron being formed by a plurality of sub-member portions each having a capability of being integrated to each other in order to form one package, wherein at least a first sub-member portion thereof is provided with said semiconductor chip therein, and a second sub-member portion in which a semiconductor chip may optionally be provided.

8. An IC package according to claim 7, wherein said first sub member portion comprises a plurality of said pins arranged on at least one face of said first sub member portion, said semiconductor chip being installed inside a body portion of said sub member portion, a plurality of said conductive leads arranged inside a body portion of said first sub member portion and a plurality of connectors on at least one surface thereof which can be attached to said second sub member portion.

9. An IC package according to claim 7, wherein said second sub member portion comprises a plurality of said pins arranged on at least one face of said second sub member portion, a plurality of said conductive leads arranged inside a body portion of said second sub member portion, and a plurality of connectors on at least one surface thereof which can be attached to said first sub member portion.

10. An IC package according to claim 7, wherein said first and second sub member portions are connected and integrated to each other by mating connectors provided on each one of said first and second sub member portions.

11. An IC package comprising a semiconductor chip, a plurality of pins, and a plurality of conductive leads, said IC package having a configuration of a polyhedral shape, and being provided with said plurality of pins arranged on at least one face of a plurality of faces of said polyhedron, said semiconductor chip being installed inside a body portion of said polyhedron package, said conductive leads being arranged inside a body portion of said polyhedron package to connect said pins and said semiconductor chip, and an access hole on at least one face of said polyhedron package for providing communication with an interface capable of being accessed from outside said polyhedron package.

12. An IC package according to claim 11, wherein said interface is an interface selected from the group consisting of a physical interface, an electrical interface, and an optical interface.

13. An IC package according to claim 11, wherein said access hole provides a path for transmitting either information or drive power.

14. An IC package according to claim 11, wherein said access hole is provided in the approximate center of at least one face of said polyhedron.

15. An IC package according to claim 11, wherein said access hole is provided through a body portion of said portion package so as to communicate said access hole provided on one face of said package with another said access hole provided on another face of said package.

* * * * *